(12) United States Patent
Fu et al.

(10) Patent No.: US 7,375,591 B2
(45) Date of Patent: May 20, 2008

(54) ROBUST FALSE LOCKING PREVENTION IN REFERENCELESS FREQUENCY ACQUISITION

(75) Inventors: Zhuo Fu, Austin, TX (US); Adam B. Eldredge, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 43 days.

(21) Appl. No.: 11/462,410

(22) Filed: Aug. 4, 2006

(65) Prior Publication Data

US 2008/0042757 A1 Feb. 21, 2008

(51) Int. Cl.
*H03L 7/085* (2006.01)
*H03L 7/10* (2006.01)

(52) U.S. Cl. .................. 331/1 A; 331/18; 331/25; 375/376

(58) Field of Classification Search ............ 331/1 A, 331/16, 18, 25, 34; 327/156–159; 375/376
See application file for complete search history.

(56) References Cited

U.S. PATENT DOCUMENTS

| | | |
|---|---|---|
| 4,456,890 A | 6/1984 | Carickhoff |
| 4,464,771 A | 8/1984 | Sorensen |
| 4,984,255 A | 1/1991 | Davis et al. |
| 5,036,529 A | 7/1991 | Shin |
| 5,297,173 A | 3/1994 | Hikmet et al. |
| 5,297,869 A | 3/1994 | Benham |
| 5,305,323 A | 4/1994 | Lada |
| 5,486,794 A | 1/1996 | Wu et al. |
| 5,754,080 A | 5/1998 | Chen et al. |
| 5,764,651 A | 6/1998 | Bullock et al. |
| 5,799,048 A | 8/1998 | Farjad-Rad et al. |
| 5,835,501 A | 11/1998 | Dalmia et al. |
| 5,987,085 A | 11/1999 | Anderson |
| 6,041,090 A | 3/2000 | Chen |
| 6,137,372 A | 10/2000 | Welland |
| 6,178,213 B1 | 1/2001 | McCormack et al. |
| 6,285,722 B1 | 9/2001 | Banwell et al. |
| 6,316,966 B1 | 11/2001 | Chang et al. |

(Continued)

OTHER PUBLICATIONS

Giga "2.5 Gbit/s Clock and Data Recovery GD16522," Data Sheet Rev. 20, Giga, Sep. 25, 2000, pp. 1-11.

(Continued)

*Primary Examiner*—David Mis
(74) *Attorney, Agent, or Firm*—Zagorin O'Brien Graham LLP (57) ABSTRACT

An output of an oscillator of a phase-locked loop is swept across a predetermined frequency range by varying control settings associated with the oscillator. A plurality of control settings that cause the oscillator to lock or falsely lock to the timing of an input data stream are determined at least in part according to a bit error rate. The bit error rate is based on transitions of the input data stream occurring in an error zone, the error zone being a predefined phase zone of a sample clock sampling the input data stream. When two control settings that cause the oscillator to lock or false lock are in a same locking region based on proximity of the control settings to each other, a preferred control setting is determined between the two according to respective values of the two control settings. True lock settings are distinguished from false lock settings based on an evaluation of bit errors that occur in an expanded error zone.

22 Claims, 8 Drawing Sheets

U.S. PATENT DOCUMENTS

| | | |
|---|---|---|
| 6,347,128 B1 | 2/2002 | Ransijn |
| 6,392,457 B1 | 5/2002 | Ransijn |
| 6,463,109 B1 | 10/2002 | McCormack et al. |
| 6,577,689 B1 | 6/2003 | Smith et al. |
| 6,591,383 B1 | 7/2003 | Michel et al. |
| 6,623,185 B1 | 9/2003 | Peragine |
| 6,628,112 B2 | 9/2003 | Pisipaty |
| 6,630,868 B2 | 10/2003 | Perrott et al. |
| 6,654,383 B2 | 11/2003 | Haymes et al. |
| 6,785,354 B1 | 8/2004 | Dietrich |
| 6,833,763 B2 | 12/2004 | Chung |
| 6,856,202 B2 | 2/2005 | Lesso |
| 6,856,206 B1 | 2/2005 | Perrott |
| 6,927,635 B2 | 8/2005 | Miki et al. |
| 6,954,506 B2 * | 10/2005 | Cho ............................ 375/321 |
| 6,988,227 B1 | 1/2006 | Perrott |
| 2002/0089356 A1 | 7/2002 | Perrott et al. |
| 2002/0191640 A1 | 12/2002 | Haymes et al. |
| 2003/0001557 A1 | 1/2003 | Pisipaty |
| 2005/0147197 A1 | 7/2005 | Perrott |

OTHER PUBLICATIONS

Gutierrez, German, et al., "2.488 Gb/s Silicon Bipolar Clock and Data Recovery IC for SONET (OC-48)," IEEE Custom Integrated Circuits Conference 1998, pp. 575-578.

Gutierrez, German, et al., "Unaided 2.5 Gb/s Silicon Bipolar Clock and Data Recovery IC," IEEE Radio Frequency Integrated Circuits Symposium 1998, pp. 173-176.

Kawai, M., et al., "Smart Optical Receiver with Automatic Decision Threshold Setting and Retiming Phase Alignment," Journal of Lightwave Technology, vol. 7, No. 11, Nov. 1989, pp. 1634-1640.

Maxim, "2.5Gbps, Low-Power, +3.3V Clock Recovery and Data Retiming IC," Maxim Integrated Products, 1998, pp. 1-8.

Matsumoto, Y., et al., "An adaptive decision threshold control of the optical receiver for multi-gigabit terrestrial DWDM transmission systems," 2000 Optical Society of America, pp. TuR2-1 through TuR2-3.

Silicon Laboratories, "SiPHY™ Multi-Rate SONET/SDH Clock and Data Recovery IC," Si5020-DS06, Preliminary Rev. 0.6 Jul. 2000, pp. 1-16.

* cited by examiner

| fcalNear | betterBER | ilAccum Closer to center than ilAccumMin | bestFcal | bestBER | ilAccumMin |
|---|---|---|---|---|---|
| 1 | x | 1 | Current fcal | currentBER | Current ilAccum |
| 1 | x | 0 | bestFcal | bestBER | ilAccumMin |
| 0 | 1 | x | Current fcal | currentBER | Current ilAccum |
| 0 | 0 | x | bestFcal | bestBER | ilAccumMin |

ROBUST FALSE LOCKING PREVENTION IN REFERENCELESS FREQUENCY ACQUISITION

CROSS-REFERENCE TO RELATED APPLICATION(S)

Background

1. Field of the Invention

The present invention relates to data communication and more particularly to acquisition of a clock signal associated with the data communication.

2. Description of the Related Art

Communication systems frequently transmit data in which the clock is embedded in the data stream rather than sent as a separate signal. When the data stream is received, a clock and data recovery circuit recovers the embedded clock based on transitions in the data stream and retimes the received data to the recovered clock. Traditionally, a phase-locked loop (PLL) has been used to perform the clock recovery operation. In order to help the PLL acquire the frequency of (or lock to) the input data stream, it has been common to use a reference clock to center the PLL output frequency for a nominal output that approximates the frequency of the input data stream. In a typical application, the VCO will multiply the reference clock by a predetermined (or selectable factor), to achieve the nominal PLL output.

However, the requirement for a reference clock (generally differential) adds both cost and design complexity to the system in which a clock and data recovery circuit resides. The clock has to be supplied by a relatively high cost crystal oscillator component and distributed to the clock and data recovery circuit using design practices appropriate for high speed clock signals.

In addition to using the reference clock to center the nominal output of the PLL, the reference clock is also used to determine whether lock has been achieved. Typical lock-detect circuitry compares the reference clock to a divided down version of the recovered clock, and if the difference between the two clocks is sufficiently high, the PLL is determined to be out-of-lock.

It would be desirable to be able to provide a communication system that can acquire a clock signal embedded in an input data stream without having to use a reference signal. That would both save pins on the clock and data recovery integrated circuit and release the system from the cost and design complexity of having to supply a reference clock.

SUMMARY

Accordingly, in one embodiment a method is provided for acquiring a timing of an input data stream without a reference clock. The method includes varying control settings of an oscillator of a control loop to vary an output of the oscillator across a specified tuning range of the oscillator and determining a plurality of control settings for the oscillator over the tuning range that cause the control loop to lock or appear to lock to the timing of the input data stream. The control settings that lock or appear to lock have fewer transitions of the input data stream in an error zone than other of the control settings. The error zone is a predetermined portion of a period of a sample clock sampling the input data.

In an embodiment, the method includes evaluating transitions of the input data stream in the error zone during a number of evaluation periods and increasing a size of the error zone during at least one evaluation period. True lock and false lock settings can be distinguished according to transitions occurring in the larger error zone during the at least one evaluation period.

In an embodiment the method includes determining that two control settings that lock or false lock are near according to proximity of respective control settings for the two control settings, and selecting one of the two control settings as a preferred control setting according to which of the two control settings is closest to a centered control setting. In an embodiment the tuning range is programmable and/or the size of the error zone is programmable.

The method may further include maintaining a stored best control setting while adjusting the output of a controllable oscillator over the tuning range. A current control setting is substituted for the stored best setting if the current control setting is in a same locking region as the stored best control setting and if the current control setting is more centered than the stored best control setting.

The method may further include, while adjusting the output of the controllable oscillator over the tuning range, maintaining a stored best control setting and substituting a current control setting for the stored best control setting if the current control setting has fewer errors than the stored best control setting in an evaluation period having a wider error zone than other evaluation periods, the errors being determined according to transitions in the error zone.

Another embodiment provides an integrated circuit for receiving an input data stream and locking to the input data stream. The integrated circuit includes a control circuit coupled to vary an output of an oscillator to vary a frequency of an oscillator output signal across a predetermined frequency range by varying control settings associated with the oscillator. The integrated circuit further includes a phase zone detect circuit coupled to determine if a transition of the input data stream occurs in a predetermined phase zone of a sample clock used to sample the input data stream. The control circuit is further operable to determine a plurality of control settings in the frequency range that lock or falsely lock the oscillator output signal to the timing of the input data stream based at least in part according to transitions of the input data stream that occur in the predetermined phase zone being below an acceptable level.

In an embodiment the size of the predetermined phase zone is variable.

In an embodiment the integrated circuit further includes a storage location storing a current best control setting; and the control circuit is operable, if the current control setting is not in a same locking region as the current best control setting, to replace the current best control setting with the current control setting if the current control setting has fewer bit errors than the current best control setting, the bit errors being determined according to transitions of the input data stream occurring in the predetermined phase zone.

In an embodiment the control circuit is operable to replace a stored best control setting with the current control setting if the current control setting is in the same locking region as the stored best control setting and if the current control setting is more centered than the stored best control setting. The current control setting is determined to be in the same locking region according to proximity of the current control setting to the stored best control setting.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
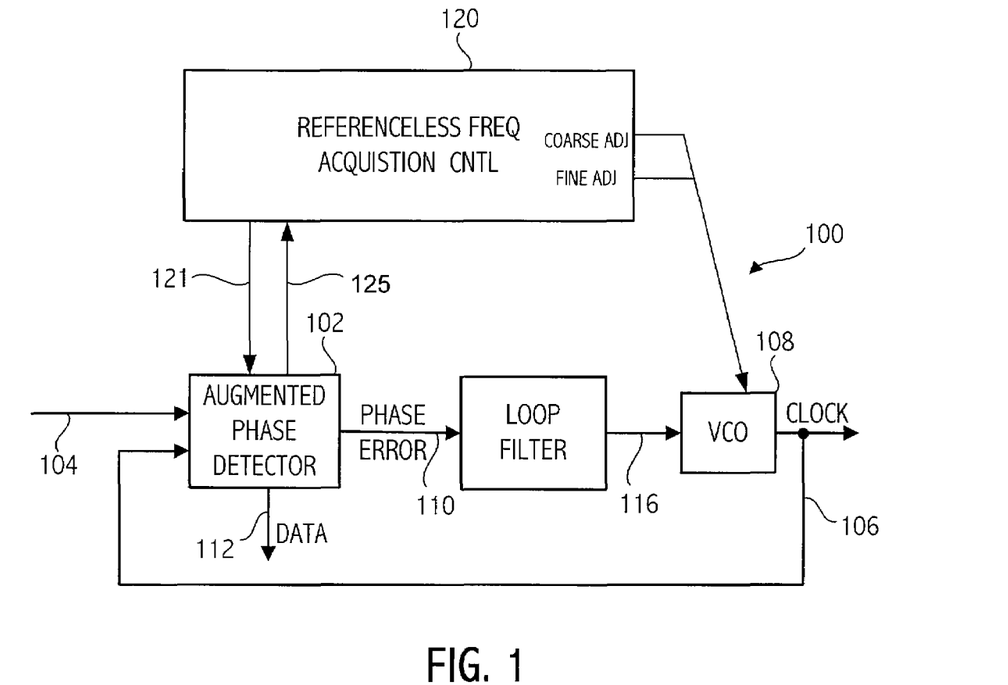
FIG. 1 shows a block diagram of a PLL configured for clock and data recovery operations according to an embodiment of the invention.

Referring to FIG. 1, a simplified block diagram of a phase-locked loop (PLL) 100 in accordance with an embodiment of the invention is illustrated. The PLL 100 includes an augmented phase detector 102, which receives the input data signal conveyed on node 104 and also receives the VCO output clock signal conveyed on node 106 from the voltage controlled oscillator (VCO) 108. Note that feedback dividers (not illustrated to simplify the figure) may be utilized. The phase detector 102 generates an error signal 110, which is a function of the phase difference between the input data signal and the VCO output clock signal. The phase detector 102 may also include additional circuitry to generate the reconstructed data on output node 112. In addition, FIG. 1 illustrates an exemplary referenceless frequency acquisition control circuit 120 that controls the PLL 100 to acquire the timing of (i.e., lock to) the input data stream. Additional details on the operation of the augmented phase detector and the referenceless frequency acquisition control circuit 120 are provided herein.

Figure 2:
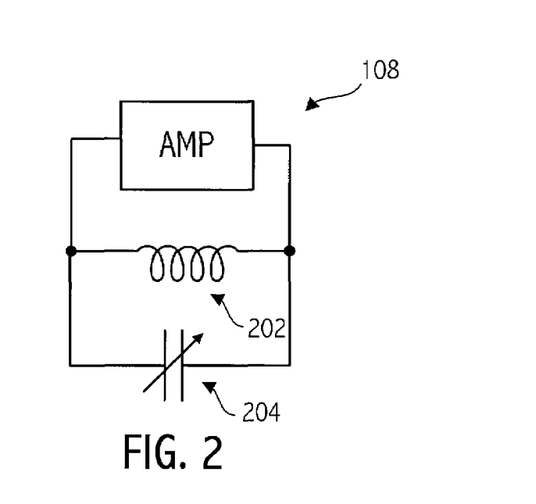
FIG. 2 illustrates an exemplary voltage controlled oscillator (VCO) for use in the PLL of FIG. 1.

An exemplary embodiment of voltage controlled oscillator (VCO) 108 is shown in FIG. 2. In that embodiment, the voltage controlled oscillator is implemented as a tank circuit (an LC oscillator) in which the frequency of oscillation depends on the inductance (L) 202 and a variable capacitance (C) 204. In the illustrated embodiment, the output of the VCO is adjusted by varying the capacitance 204, which includes controllable capacitor circuits well known in the art. In an exemplary embodiment, the variable capacitance 204 provides coarse and fine grained capacitance control. The coarse control may be implemented by a bank of capacitor/switch circuits each controlled by one or more bits of a coarse grained digital control word. The fine control may be implemented by a bank of capacitor/switch pairs controlled by one or more bits of a fine-grained digital control word. Capacitance 204 is varied to lock the VCO to the input data stream without the use of a reference clock.

Before the referenceless frequency acquisition architecture shown in FIG. 1 is described in more detail, a description of the operation of a traditional phase detector is provided to help better explain how referenceless frequency acquisition works.

Figure 3:
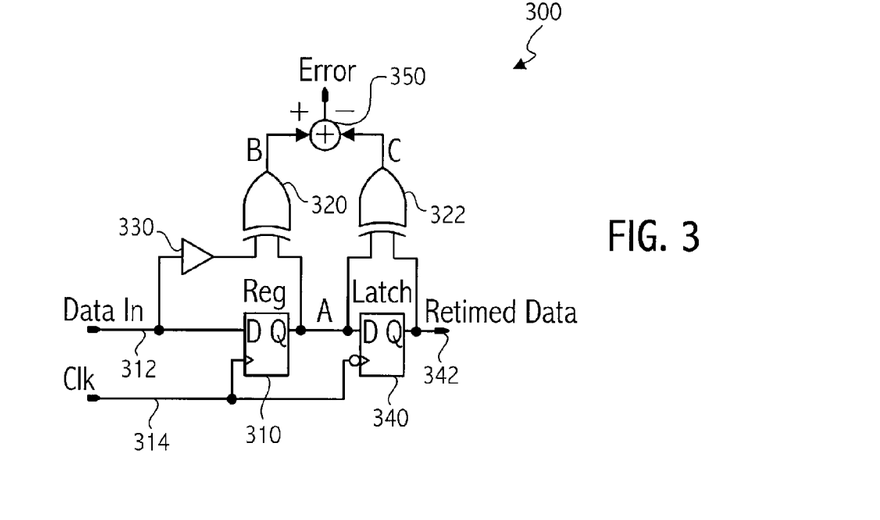
FIG. 3 depicts a common phase detector.

FIG. 3 depicts a common phase detector that is well known in the art. In this circuit, a register 310 samples the input data signal conveyed on node 312 when clocked by the sample clock signal conveyed on node 314. The sample clock signal conveyed on node 314 is the recovered clock from the input data signal. XOR gate 320 generates on its output node B a variable-width pulse of duration generally equal to the time by which an input data signal transition leads the corresponding transition on node A, the output of register 310, which is controlled, of course, by the recovered clock conveyed on node 314. The delay block 330 is included to compensate for the clock-to-Q delay of register 310. When the data clock is correctly aligned to the input data signal (i.e., data clock transitions at precisely the mid-point of the data bit-intervals), the register 310 generates on its output node A, a signal that replicates the input data signal, but delayed by one-half period of the data clock, and the pulse on node B is of a duration exactly equal to one-half period of the data clock.

The latch 340 generates on its output node 342 a signal which replicates its input signal delayed by one-half period of the recovered clock. As a result, the second XOR gate 322 generates on its output node C a pulse with a duration that is equal to one-half of the period of the recovered clock. The fixed-duration pulse signal conveyed on node C is subtracted from the variable-width pulse signal conveyed on node B by summing block 350 to generate a phase error signal used to adjust the recovered clock.

Figure 4:
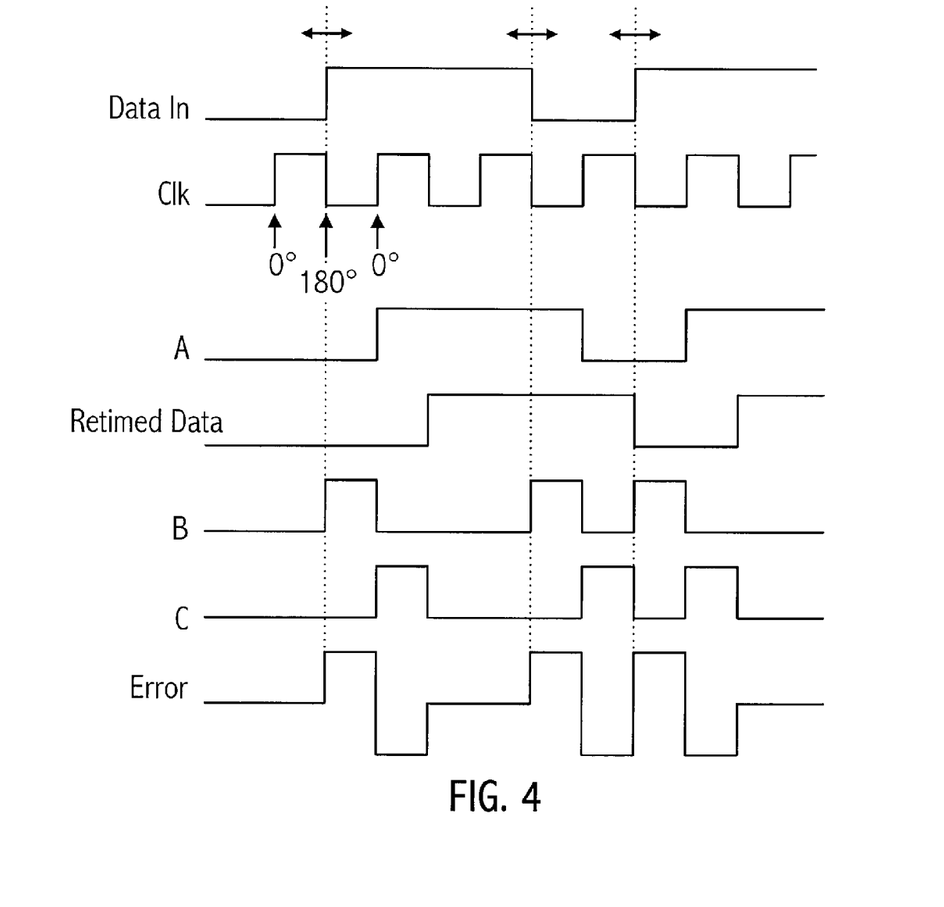
FIG. 4 shows a timing diagram illustrating operation of the phase detector shown in FIG. 3.

Operation of the phase detector shown in FIG. 3 is illustrated by the timing diagram shown in FIG. 4. When the data clock is correctly aligned, as illustrated in FIG. 4, both pulse signals have equal duration, and the summing block 350 generates a zero-valued net error current. If the input data transition arrives too early, the pulse signal on node B is longer than the pulse signal on node C, and a net error current is generated and supplied to vary the output of the VCO.

As described previously, one method of determining if the VCO is correctly locked to the clock embedded in the input data stream is to compare the recovered clock to a reference clock. If a reference clock is unavailable, another approach has to be used both for initially setting the VCO frequency and for determining if lock has been achieved. As described further herein, frequency detection can be accomplished by detecting whether transitions fall into a predetermined phase zone (also referred to herein as a "forbidden zone") of the data clock used in the phase detector. The "forbidden zone" is a predetermined portion of the period of the sample clock used in the phase detector. When the PLL is in-lock, transitions typically will not fall into this zone. When the PLL is out-of-lock, transitions will often fall into the zone. By performing a test over many trials to determine whether data transitions in the input data stream are falling into the forbidden zone, it can be statistically inferred whether the PLL is in-lock, and thus has acquired the timing of the input data stream.

Figure 5:
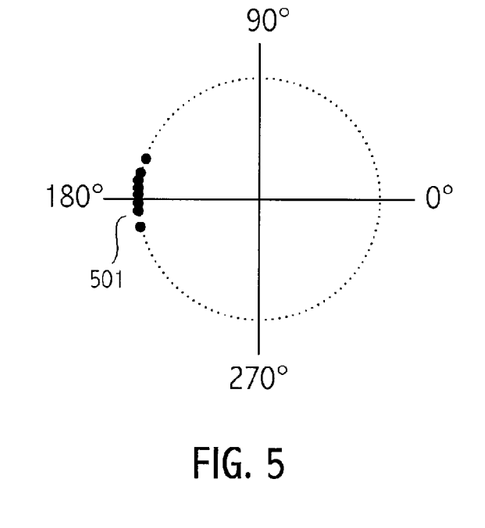
FIG. 5 illustrates the ideal placement of data transitions within the phase window of the clock used to sample the data.
Figure 6:
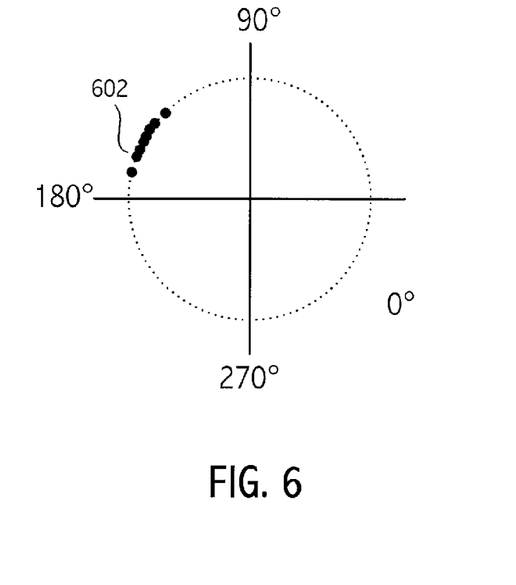
FIG. 6 illustrates the movement of the transitions clockwise with respect to the 180 degree point of the sample clock in the phase detector.
Figure 7:
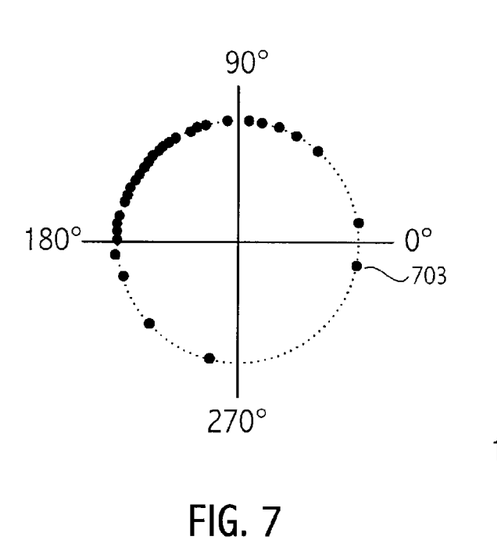
FIG. 7 illustrates the effect of phase offset and increased jitter amplitude on the location of the data transitions.

Referring again to FIGS. 3 and 4, the first register 310 of the phase detector 300 samples the data at 0 degrees, i.e., the leading edge of the recovered clock used to sample the data. Thus, data transitions of the input data stream ideally occur around 180 degrees with respect to the recovered clock to maximize the likelihood that a transition is detected given the existence of jitter and phase offset. FIG. 5 illustrates the preferred placement of data transitions 501 assuming low jitter. FIG. 6 illustrates the influence of phase offset on the placement of data transitions with respect to the phase of the recovered clock being used to sample the data in the first register of the phase detector 300 in FIG. 3. As can be seen in FIG. 6, the transitions have moved clockwise with respect to the recovered clock. FIG. 7 illustrates the effect of phase offset and increased jitter amplitude. The data transitions can be seen to be more distributed in the phase of the recovered clock. If the jitter is sufficiently high, it can lead to bit errors such as transition 703.

Figure 8:
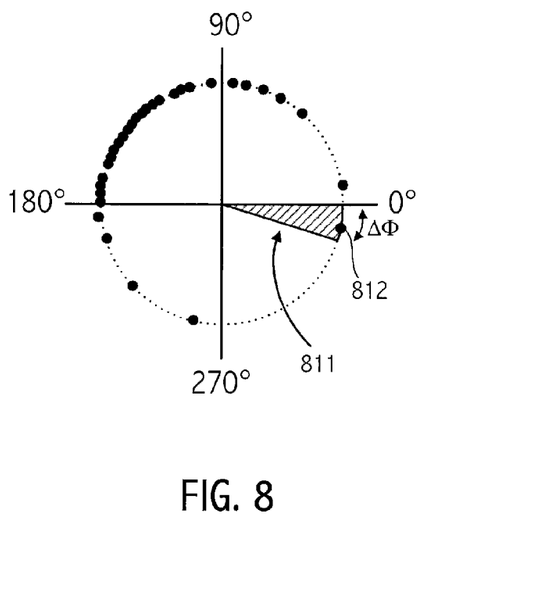
FIG. 8 illustrates the "forbidden zone" of the sample clock.

Thus, a referenceless frequency acquisition approach can be used to detect the frequency of an input data stream. Referring to FIG. 8, a small phase window or "forbidden zone" 811 can be defined. Any transitions, such as transition 812, that occur in that phase window 811, are assumed to be bit errors. The phase window 811 (also shown as Δφ) should be placed on the side of the zero degree mark that is farthest from the placement of the data transitions that occur due to phase offset. There may be a systemic offset due to, e.g., circuit delays, as well as random offset. The systemic offset in one embodiment rotates the placement of the data transitions clockwise from the 180 degree mark. Thus, the forbidden zone in such an embodiment is offset in a clockwise direction from the zero degree mark as shown in FIG. 8. In other embodiments, the phase zone can reside on the other side of the zero degree point.

Figure 9:
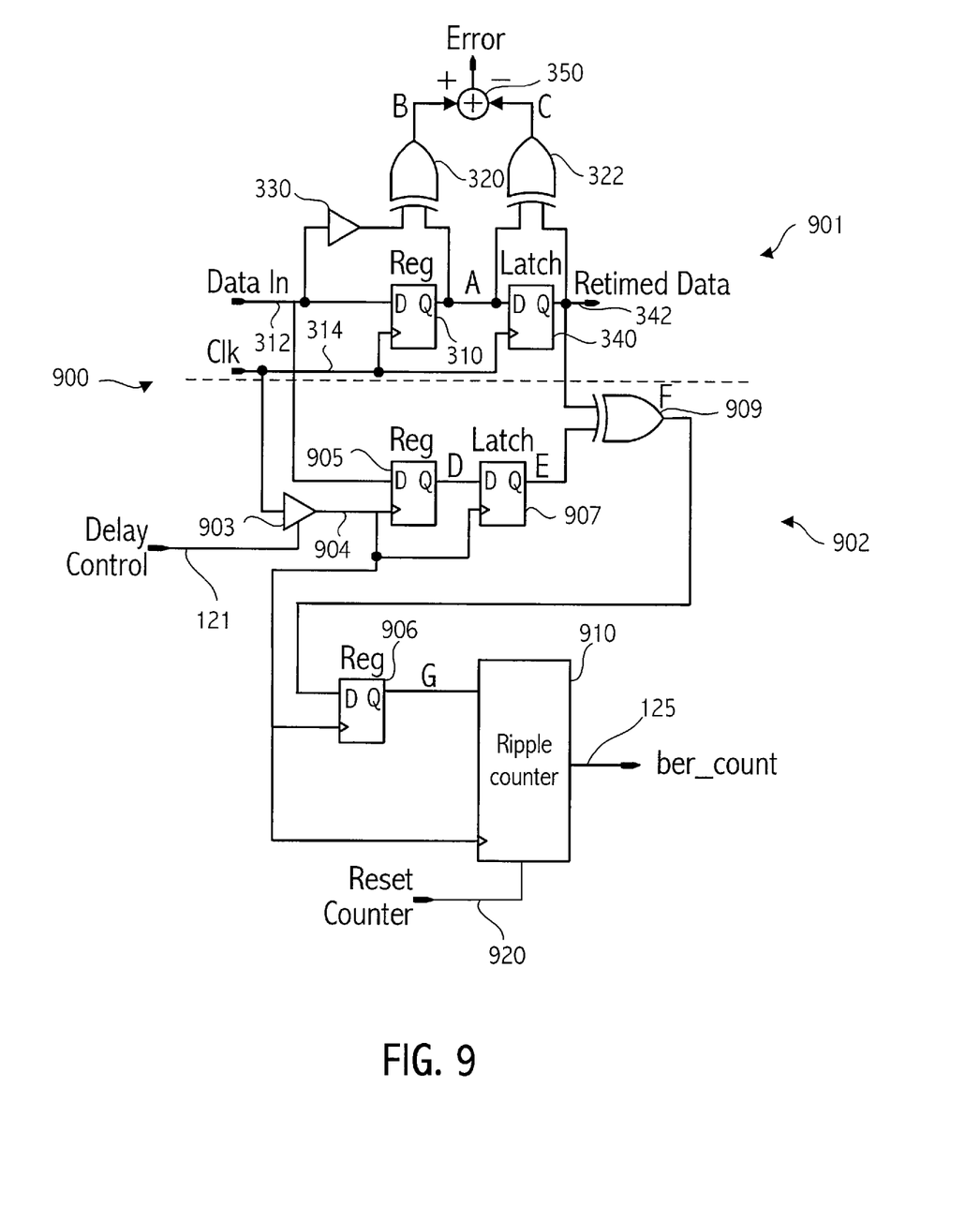
FIG. 9 illustrates an augmented phase detector circuit that detects transitions in the forbidden zone.

If the PLL has not locked to the frequency of the input data stream, data transitions will eventually fall into the forbidden zone. That information can be used to determine whether the PLL has locked, and if it has not, adjust the output of the VCO until it does. The "forbidden zone" approach requires a circuit that detects transitions that occur in the forbidden zone. FIG. 9 illustrates a simplified diagram of an augmented phase detector circuit 900 that detects transitions in the forbidden zone. Comparing the phase detectors in FIG. 9 and FIG. 3, it can be seen that the top half 901 of the phase detector circuit 900 is substantially identical to the phase detector 300 shown in FIG. 3 and operates conventionally to generate an error signal from summer 350 indicating the phase error between the data in signal 312 and the clock signal 314 supplied from the VCO. In addition to the conventional phase detector 901 illustrated, the phase detector of FIG. 9 further includes forbidden zone circuitry 902 that detects transitions occurring in the forbidden zone of the clock signal 314. That circuitry includes a controllable delay element 903 that functions to delay the clock 314 by an amount corresponding to the size of the desired phase window. A small delay element may be used, e.g., a buffer.

Control line 121 may be used to control the delay through delay element 903. The delay control signal 121 may control the delay through delay element 903 in various ways known in the art. For example, the number of delay elements may be varied or electrical parameters of the delay element may be varied, according to the value of the control signal 121. In another embodiment, the delay circuit may be implemented as a phase interpolator to vary the delay. The delayed clock 904 is supplied to registers 905 and 906 and to the latch 907. The XOR gate 909 generates a pulse that indicates the difference between the retimed data on node 342 and the delayed data supplied from latch 907. Note that the latches 340 and 907 are configured to pass data when the clock is low. The output from register 906 is supplied to a ripple counter 910 that counts the number of bit errors detected, i.e., transitions in the forbidden zone. The ripple counter 910 may be reset by control signal 920. Note that although the embodiment described in FIG. 9 has been shown with a linear phase detector, the approach described herein would also work with other types of phase detectors such as a binary or a sub-rate phase detector.

Figure 10A:
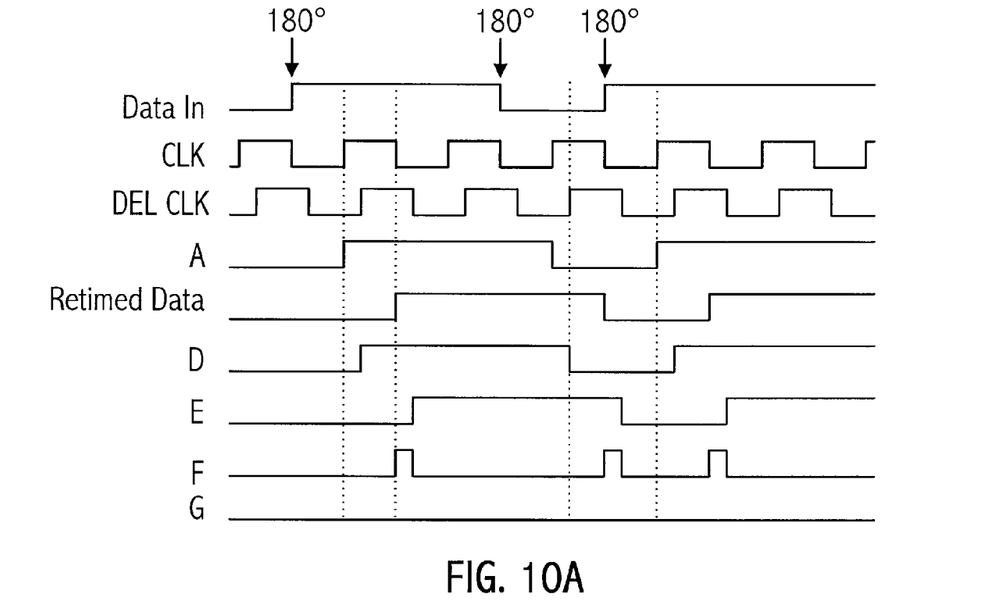
FIG. 10A illustrates data transitions at 180 degrees with respect to the phase of the sample clock signal.

The operation of the circuit of FIG. 9 is illustrated in the timing diagrams 10A and 10B. In FIG. 10A the data is transitioning in the ideal location at 180 degrees with respect to the phase of the clock signal 314 (shown as CLK in FIGS. 10A and 10B). The output from the registers and latches are shown to create a pulse on node F from XOR gate 909. However, the duration of that pulse is short and therefore is not clocked into register 906 by the rising edge of the delayed clock (DEL CLK). Thus, no error is detected and counter 910 does not count an error.

Figure 10B:
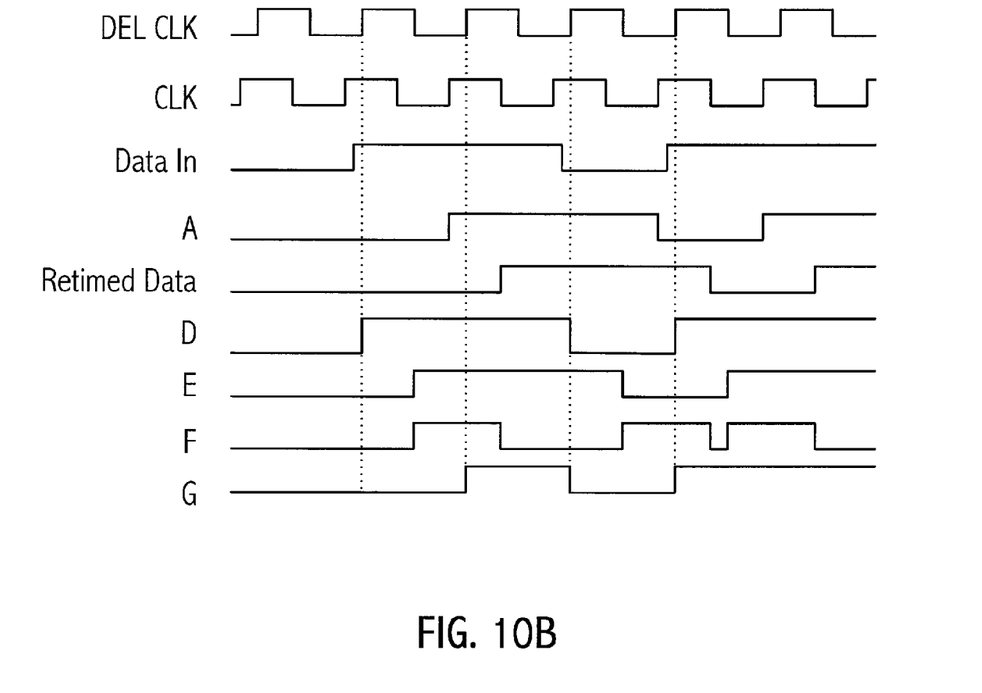
FIG. 10B illustrates the operation of the phase detector shown in FIG. 12A when data transitions occur in the forbidden zone.

Referring to FIG. 10B, the operation of phase detector 900 is illustrated for the case where data transitions do occur in the forbidden zone. When that occurs, the transition on Data In occurs after the rising edge of CLK conveyed on node 314 and thus is not clocked into register 310. The delayed clock 904 (DEL CLK in FIG. 10B) is delayed sufficiently to catch the transition and thus the transition is stored in register 905. As the transition or lack thereof propagates through the latches 907 and 340, XOR gate 909 generates a pulse output on node F that is clocked into register 906 on the rising edge of the delayed clock. That in turn causes the counter 910 to count on the next rising edge of the delayed clock.

As described more fully herein, the ability to detect the forbidden zone transitions allows the VCO output to be adjusted until transitions in the forbidden zone occur at a rate below the allowable bit error rate. Additional details on referenceless frequency acquisition in general and on embodiments of augmented phase detectors that may be suitable for use in various embodiments of the invention can be found in U.S. Pat. No. 6,856,206, entitled "Method and Apparatus for Acquiring a Frequency without A Reference Clock," which is incorporated herein by reference in its entirety.

Because the PLL is being declared in-lock or out-of-lock based on detection of transitions in the forbidden zone, there exists the possibility of falsely declaring the PLL being out-of-lock because of a high bit error rate (BER) causing transitions to occur in the forbidden zone. There also exists the possibility of falsely declaring lock because sufficient transitions did not fall into the forbidden zone over a period of time. Remember that in a preferred embodiment, the data is encoded in an NRZ format or an equivalent and therefore transition density can vary based on data patterns.

Figure 11:
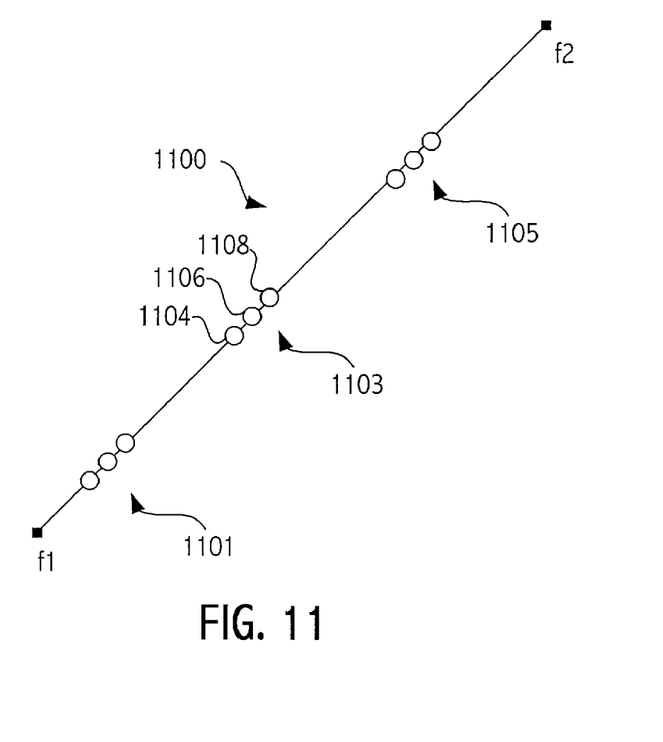
FIG. 11 illustrates clustering of lock or false lock VCO settings along a particular VCO tuning range.

One approach to referenceless frequency acquisition is to select the first VCO setting for which the locking criteria were satisfied (sufficiently few transitions in the forbidden zone) as the VCO setting for lock. One problem with that approach is that the pull range of the VCO may be larger than the granularity of the capacitance variations. That can result in multiple VCO settings that lock to the timing of the data. Therefore, a preferred setting among the multiple settings providing lock needs to be selected. Another problem is that false locks can occur, particularly at frequencies of (n+/−1)/n of data frequency. FIG. 11 illustrates an exemplary locking scenario. Assume the tuning range of the VCO is represented by 1100. Note that in some embodiments the tuning range endpoints $f_1$ and $f_2$ may be programmable. The tuning range may be programmed by writing registers specifying the endpoints $f_1$ and $f_2$, e.g., by specifying capacitor settings associated with the endpoints. Because the center frequency may vary slightly from part to part due to process variations, adjusting the desired tuning range can reduce potential false locking. For example, assume the center frequency is higher than a nominal value. By reducing the tuning range at the high end, potential false locking conditions, which would otherwise be more prevalent at the higher end of the tuning range can be eliminated by programming the tuning range appropriately.

FIG. 11 illustrates a scenario in which the tuning range of the VCO has three separate clusters of frequencies 1101, 1103, and 1105, and each of three VCO control settings within those three clusters (e.g., control settings corresponding to frequencies 1104, 1106, and 1108) will cause the number of transitions in the forbidden zone to be sufficiently low as to indicate lock. However, only one of the clusters is a true lock and the other two clusters are false locks. In addition, three VCO settings within the true lock cluster will cause the VCO to lock at the right frequency because the pull range of the VCO is sufficiently wide as to lock to the frequency of the data stream. Multiple settings may also cause the VCO to false lock at a false lock frequency due to the VCO pull range. For example, the pull range may be several thousand parts per million.

The referenceless frequency approach described herein accounts for the possibilities of false locks and can also select a preferred setting when multiple settings provide a true lock. In an embodiment, the referenceless frequency acquisition approach sweeps through the tuning range of the VCO by varying the adjustable capacitance 204 (see FIG. 2). In the embodiment described herein, a coarse capacitor setting is selected and then the fine capacitor settings are swept linearly. Other embodiments may use different approaches to sweeping through the tuning range of interest of the VCO. All the VCO settings that cause the VCO to lock or false lock to the data are determined. There may be several VCO capacitor settings that cause the VCO to lock or false lock to data and result in the same VCO output frequency. In an embodiment, control settings for the VCO are considered to be in the same locking region if the coarse capacitor settings differ by at most one. For each region, the best VCO setting is found by selecting the VCO setting with the most centered value. That will maximize the ability for the CDR to stay locked to the data when there is temperature variation, aging, or other factors that cause the VCO center frequency to drift.

As the control circuit 120 sweeps the desired tuning range of the VCO it has to distinguish between true and false lock settings. In order to distinguish between true lock and false lock settings, multiple evaluation stages are used to determine those VCO settings having a sufficiently low number of errors. During one of the evaluation stages, the size of the forbidden zone is increased, e.g., from 20 ps to 35 ps. True lock settings can be distinguished from false locks because false lock settings will have more errors in the wider forbidden zone.

Figure 12:
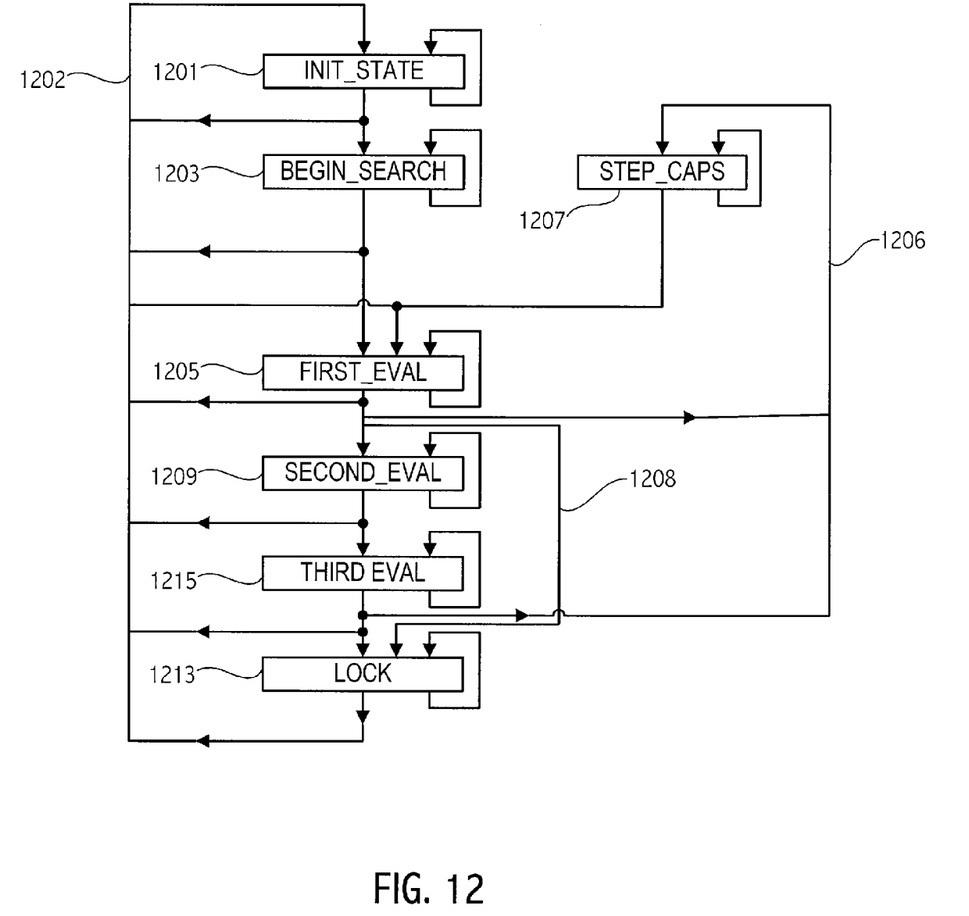
FIG. 12 illustrates operation of an embodiment of a state machine for referenceless frequency acquisition.

Referring now to FIG. 12, illustrated is an embodiment of the control structure utilized to acquire a frequency. FIG. 12 illustrates operation of a state machine implemented in referenceless frequency acquisition control circuit 120 (see FIG. 1). In the INIT state 1201, the initial search value for a coarse capacitor setting is chosen. The state machine then goes to BEGIN_SEARCH 1203 in which the fine capacitor settings are set to a minimum or other appropriate value corresponding to an initial search value. In addition, signals associated with the referenceless frequency acquisition state machine are reset. After a delay sufficient to allow all signals to settle and the system to be stable, the state machine enters the FIRST_EVAL state 1205. Note that all the states may exit back to the INIT_STATE 1201 through path 1202 in response to a condition such as a reset or other condition that causes the referenceless frequency acquisition to stop.

Each evaluation state includes multiple trials and each trial includes multiple bit times. On entering the FIRST_EVAL state 1205, the bit error counter and the trial counter are initialized. Bit errors are determined to be those transitions that occur in the forbidden zone. The evaluation in the FIRST_EVAL state 1205 is intended to provide a fast indication of lock or lack thereof after relatively few trials (only 16 trials). In an embodiment, the control logic is being clocked at a rate significantly slower than the data rate. For example, the data rate may be at approximately 10 GHz, while the state machine operates at approximately 10 MHz. Thus, for each state machine clock cycle approximately 1000 bits are transmitted and evaluated by the forbidden zone detection circuit. Thus, each trial includes 1000 bit times.

If a transition occurs in the forbidden zone during a trial, the bit error counter 910 increments. The state machine may also supply a reset signal to reset the counter 910 at the beginning of every evaluation state or at the beginning of every trial depending upon the amount of information that the state machine desires to keep. The trial counter counts the number of trials over which to evaluate the existence of bit errors. In the illustrated embodiment, the FIRST_EVAL state 1205 has 16 trials (16 10 MHz clocks). If after 16 trials the bit error count is higher than a threshold, thereby indicating the current setting is not a lock, the state machine goes to the STEP_CAPS state 1207 to change the digital capacitor settings to a new control setting. In an exemplary embodiment, there are 11 coarse capacitor settings and 64 fine capacitor settings for each coarse capacitor setting.

If however, after 16 evaluation cycles are completed, the bit error count is less than the threshold, then the state machine enters the SECOND_EVAL state 1209. Note that if all the VCO control settings have been tested, that is, the entire selected tuning range of the VCO has been tested and the error count is greater than the threshold value, then the VCO goes to the LOCK state 1213.

In the STEP_CAPS state 1207, the capacitance setting of the VCO is changed to the next setting using either or both the coarse capacitance and fine capacitance setting. In addition, the inner loop accumulator is reset to a centered value at the beginning of the state. The inner loop accumulator (Ilaccum) represents an extra fine capacitor setting that is not controlled by the state machine. Instead, it is controlled by the control loop to pull the output of the VCO to the timing of the input data stream. The value of the inner loop accumulator can be used to evaluate a preferred setting when multiple settings appear to lock to the input data stream.

As described above, if the error count in the FIRST_EVAL state 1205 is sufficiently low, the state machine proceeds to the SECOND_EVAL state 1209. In the beginning of the SECOND_EVAL state 1209 the error counter and the trial counter are initialized. The forbidden zone window is increased in the second evaluation state, e.g., to 35 ps. Note that the size of the forbidden zone may be made programmable for all of the evaluation states through a serial programming interface. The larger the window size, the fewer false lock settings will have data transitions skipping the forbidden zone window. For false lock settings, the probability of the data transitions falling into the forbidden zone window is much larger than for true lock settings with jitter present on the data or the VCO clock. The difference is more prominent for a larger window size. Therefore, the error count in the second evaluation state can be used to distinguish false lock settings from true lock settings.

Figure 13:
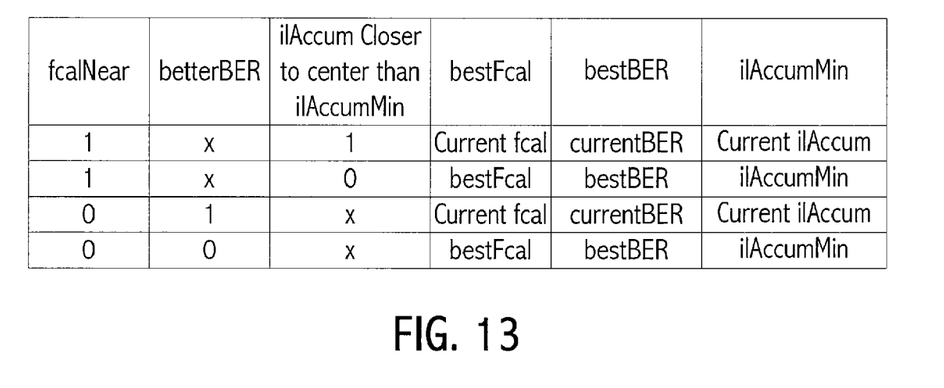
FIG. 13 illustrates registers associated with detection of lock and false lock settings, and selecting among multiple lock values.

As the state machine sweeps through the VCO tuning range, the control logic distinguishes true locks from false locks and determines a preferred lock setting among multiple lock settings. Accordingly, the control logic maintains a best VCO control setting representing the best VCO setting so far that has been determined by the state machine. The state machine makes two tests. The control logic distinguishes true locks from false locks based on the number of bit errors detected in the second evaluation state. In an exemplary embodiment, the SECOND_EVAL state 1209 has 64 trials lasting 100 ns each. Referring to FIG. 13, the table illustrates certain information maintained by the state machine, e.g., in registers to distinguish false lock and to resolve multiple lock scenarios and how those registers are updated. At the end of the SECOND_EVAL state 1209, if the current VCO control setting has fewer bit errors than the number of bit errors (bestBER) associated with the stored best VCO setting (bestFcal), than the betterBER bit is set to 1 indicating the current control setting has a better bit error rate in the SECOND_EVAL state 1209 than the bit error rate of the stored best VCO setting (bestFcal) and the bit error count of the SECOND_EVAL state 1209 is stored as the current BER. The current BER represents the error count associated with the current control setting.

Assuming the error count is below the threshold in the SECOND_EVAL state 1209, the state machine proceeds to the THIRD_EVAL state 1215. In this state, the forbidden zone size is returned to its smaller value, e.g., 20 ps using the delay control signal 121 (FIG. 1) to adjust the delay of delay element 903. Thus, in the SECOND_EVAL state 1209 the delay control signal 121 is controlled to increase the delay to the desired value and in the THIRD_EVAL state 1215 the delay value is returned to that used in the FIRST_EVAL state 1205.

Note that the referenceless frequency acquisition control circuit 120 supplies a control signal 920 to reset the counter 910 at the beginning of each evaluation state. In other embodiments, the error counter 910 may be reset for each 100 ps trial and the count value for each trial accumulated in lower speed logic during the evaluation cycle. The control circuit 120 receives the count value 125 indicating the number of detected bit errors. In other embodiments, less granular counts may be maintained, e.g., the number of trials with one or more bit errors, rather than the number of bit errors during an evaluation state.

The THIRD_EVAL state 1215 has 512 100 ps trials. In this state, a stored value (fcalNear) is set to either 0 or 1 according to whether the current VCO control value is "near" to the stored best setting. In an embodiment, fcal-Near=1 if the coarse capacitance setting of the current VCO control setting is the same as or differs by one setting from the coarse capacitance setting associated with the stored best VCO setting. As shown in FIG. 13, the table illustrates certain values maintained, evaluated and updated by the state machine while sweeping the tuning range. At the end of the 512 trials, if the error count is less than the threshold count then the values shown in FIG. 13 are updated. Specifically, if fcalNear=1, then the current VCO control setting (current fcal) replaces the stored best VCO control setting (bestFcal) if the current extra fine capacitor setting (ilAccum) is closer to the center than the extra fine capacitor setting ilAccumMin associated with the stored best VCO control setting (bestFcal). Assume the extra fine capacitor setting represents a value from −n to +n around a center capacitance setting determined by the coarse and fine settings. The lowest absolute value of the extra fine setting (ilAccum) represents the value closest to the minimum. If the absolute value of the current extra fine capacitor setting (ilAccum) is less than the extra fine capacitor setting (ilAccumMin) associated with the stored best VCO control value, then the current fcal becomes the bestFcal. In that way, the CDR can better accommodate frequency drift due to temperature variations or other causes. Note that for the fcal setting that is close to the bestFcal, either both of them are falselock or both are not falselock and ilAccum updates bestFcal according to the most centered value in either case. Note that an "X" in FIG. 13 represents a "don't care" value.

In addition, the currentBER from the second evaluation state value becomes the bestBER if betterBER=1 and fcal-Near=0. For cases where the current fcal found the data cleaner (fewer bit errors), the bestFcal could be the initial value of a reset or a false lock setting. In both cases the control logic replaces the previously found bestFcal with the current Fcal. If the current fcal has a larger bit error count for a wider forbidden zone setting, current fcal is a falselock setting, and the previously found bestFcal is maintained.

If at the end of the either the SECOND_EVAL state 1209 or the THIRD_EVAL state 1215 the error count is above the threshold, the state machine returns to the STEP_CAPS state 1207 to increment either the coarse or fine capacitor setting, which then returns to the FIRST_EVAL state 1205.

At the end of the third evaluation stage, if a lock value has been found, the system enters the lock state where loss of lock may be detected based on transition errors in the forbidden zone if the complete tuning range has been swept or returns to STEP_CAPS to continue evaluating the rest of the tuning range.

Figure 14:
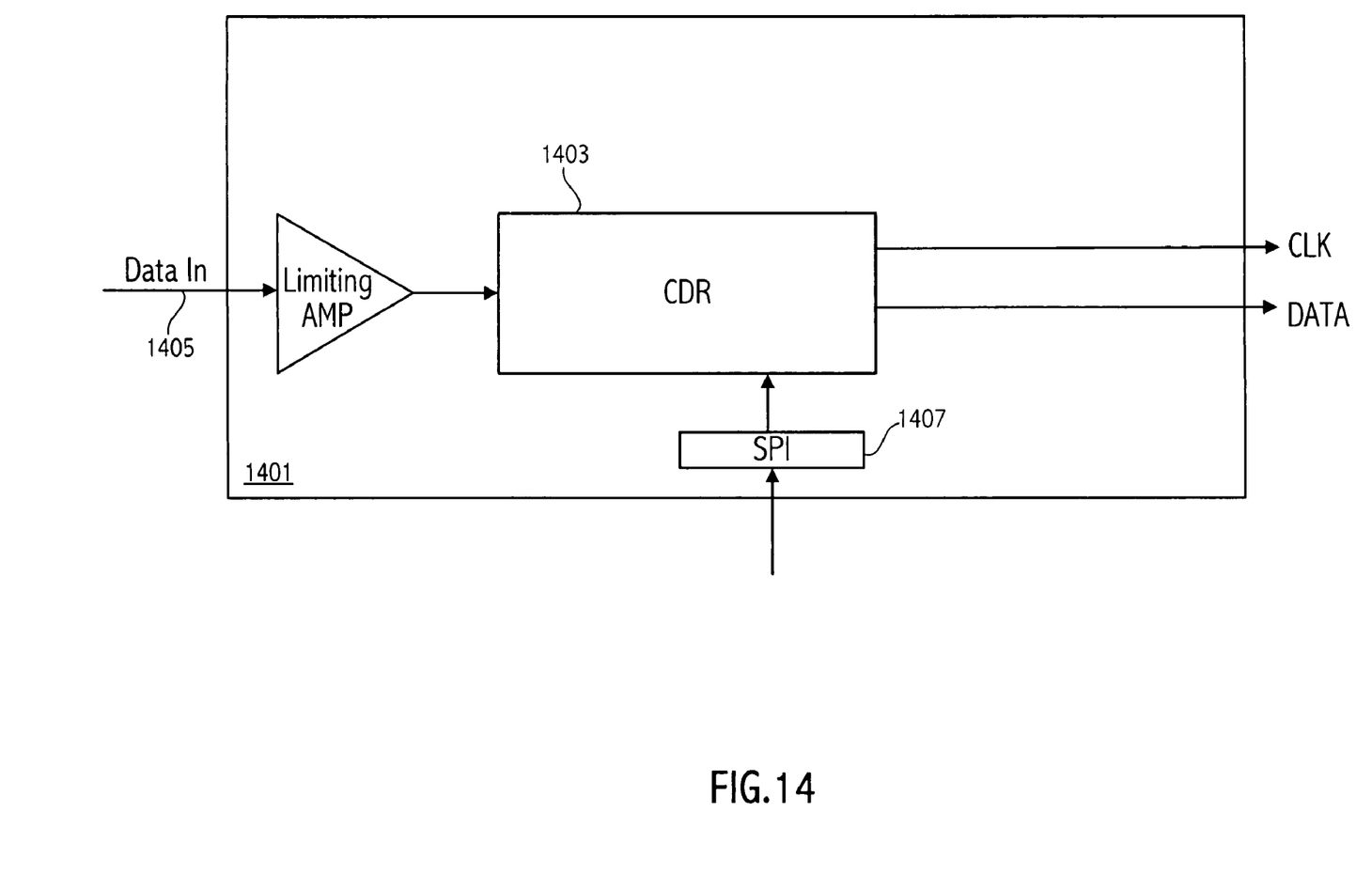
FIG. 14 shows a block diagram of a clock and data recovery integrated circuit suitable for incorporating one or more embodiments of the invention described herein.

Referring to FIG. 14, the various embodiments for referenceless frequency acquisition described herein are particularly useful in a clock and data recovery (CDR) integrated circuit 1401, which is utilized for high speed serial communication systems in which timing information and data is extracted by the CDR 1403 from the input data 1405. The CDR 1403 incorporates the PLL 100 and referenceless frequency acquisition control circuit 120. A serial programming interface (SPI) 1407 may be used to program such factors as forbidden zone window size for the various evaluation states, tuning range, and other parameters associated with the referenceless frequency acquisition. The tuning range may be programmed by writing registers specifying capacitor settings used by the control logic that determine where the tuning range starts and stops.

Thus, various embodiments have been described for locking to a clock embedded in an input data stream without the use of a reference clock. The technique to lock to the clock may also be used to monitor and report the bit error rate. The description of the invention set forth herein is illustrative, and is not intended to limit the scope of the invention as set forth in the following claims. For example, while a VCO with a tank circuit has been described, a ring oscillator, or other type of controllable oscillator having a tuning capability across a frequency range may also be utilized. Other variations and modifications of the embodiments disclosed herein, may be made based on the description set forth herein, without departing from the scope and spirit of the invention as set forth in the following claims.

What is claimed is:

1. A method of acquiring a timing of an input data stream without a reference clock, comprising:
   varying control settings of an oscillator in a control loop to vary an output of the oscillator across a specified tuning range of the oscillator;
   determining a plurality of control settings for the oscillator over the tuning range that cause the control loop to lock or false lock to the timing of the input data stream, the plurality of control settings having fewer transitions of the input data stream in an error zone than other control settings, the error zone being a predetermined portion of a period of a sample clock sampling the input data.

2. The method as recited in claim 1 further comprising:
   evaluating transitions of the input data stream in the error zone during a plurality of evaluation periods;
   increasing a size of the error zone during at least one of the evaluation periods; and
   distinguishing true lock from false lock settings according to transitions in the error zone during the at least one evaluation period having the increased size.

3. The method as recited in claim 1 further comprising:
   determining that two control settings that lock or false lock are in a same locking zone according to proximity of the two control settings; and
   selecting one of the two control settings as a preferred control setting according to which of the two control settings is closest to a centered control setting.

4. The method as recited in claim 1 further comprising programming the tuning range.

5. The method as recited in claim 2 further comprising programming a size of the error zone.

6. The method as recited in claim 1 further comprising:
   while adjusting the output of the oscillator over the tuning range, maintaining a stored best control setting;
   substituting a current control setting for the stored best control setting if the current control setting is in a same locking region as the stored best control setting and if the current control setting is more centered than the stored best control setting.

7. The method as recited in claim 1 further comprising:
   while adjusting the output of the oscillator over the tuning range, maintaining a stored best control setting; and
   substituting a current control setting for the stored best control setting if the current control setting has fewer bit errors than the stored best setting in an evaluation period having a wider error zone than other of the evaluation periods, the bit errors being determined according to transitions in the error zone.

8. The method as recited in claim 1, wherein the output of the oscillator is varied by changing a variable impedance associated with the oscillator.

9. The method as recited in claim 8, wherein the variable impedance is a capacitance.

10. The method as recited in claim 1 wherein the oscillator circuit is a voltage controlled oscillator (VCO).

11. The method as recited in claim 1 wherein the control loop is a phase-locked loop.

12. The method as recited in claim 1 further comprising identifying when two control settings that cause the control loop to lock or false lock are in a same locking region according to proximity of the control settings and storing a value indicative thereof associated with at least one of the control settings.

13. The method as recited in claim 12 further comprising selecting a preferred control setting among the two control settings according to respective values of the control settings.

14. The method as recited in claim 1 further comprising:
   expanding the error zone for a part of a time period in which a particular control setting is evaluated for bit errors;
   determining a first number of bit errors associated with the particular control setting in the expanded error zone;
   comparing the first number of bit errors to a second number of bit errors corresponding to another one of the plurality of control settings; and
   determining the particular control setting to be a true lock if the first number of bit errors is less than the second number of bit errors and a false lock setting if the first number of bit errors is greater than the second number of bit errors.

15. An integrated circuit comprising:
   means for varying an output of an oscillator across a predetermined frequency range; and
   means for identifying a plurality of control settings that cause the oscillator to lock or false lock to an input data stream at least in part according to a bit error rate determined according to transitions of the input data stream occurring in an error zone, the error zone being a predefined phase zone of a sample clock sampling the input data stream.

16. The integrated circuit as recited in claim 15 further comprising means for identifying when two control settings that cause the oscillator to lock or false lock are in a same locking region.

17. The integrated circuit as recited in claim 15 further comprising means for expanding the error zone.

18. An integrated circuit for receiving an input data stream and locking to the input data stream, the integrated circuit comprising:
   a control circuit coupled to vary an output of an oscillator to vary a frequency of an oscillator output signal across a predetermined frequency range by varying control settings associated with the oscillator; and
   a phase zone detect circuit coupled to determine if a transition of the input data stream occurs in a predetermined phase zone of a sample clock used to sample the input data stream; and
   wherein the control circuit is further operable to determine a plurality of control settings in the frequency range that lock or falsely lock the oscillator output signal to the timing of the input data stream, at least in part according to detected transitions of the input data stream that occur in the predetermined phase zone being below an acceptable level.

19. The integrated circuit as recited in claim 18 wherein a size of the predetermined phase zone is variable.

20. The integrated circuit as recited in claim 18 further comprising:

a storage location storing a current best control setting;

and wherein the control circuit is operable, if the current control setting is not in a same locking region as the current best control setting, to replace the current best control setting with the current control setting if the current control setting has fewer bit errors than the current best control setting, the bit errors being determined according to transitions of the input data stream occurring in the predetermined phase zone.

21. The integrated circuit as recited in claim 18 wherein the control circuit is operable to replace a stored best control setting with the current control setting if the current control setting is in the same locking region as the stored best control setting if the current control setting is more centered than the stored best control setting.

22. The integrated circuit as recited in claim 20 wherein whether the current control setting is determined to be in the same locking region according to proximity of the current control setting to the stored best control setting.

* * * * *

UNITED STATES PATENT AND TRADEMARK OFFICE
CERTIFICATE OF CORRECTION

| | | |
|---|---|---|
| PATENT NO. | : 7,375,591 B2 | Page 1 of 1 |
| APPLICATION NO. | : 11/462410 | |
| DATED | : May 20, 2008 | |
| INVENTOR(S) | : Zhuo Fu and Adam B. Eldredge | |

It is certified that error appears in the above-identified patent and that said Letters Patent is hereby corrected as shown below:

In column 11, claim 10, line 67, please delete "circuit".

Signed and Sealed this

Twenty-first Day of October, 2008

JON W. DUDAS
*Director of the United States Patent and Trademark Office*